(12) United States Patent
Yen et al.

(10) Patent No.: US 12,449,734 B2
(45) Date of Patent: *Oct. 21, 2025

(54) LITHOGRAPHY APPARATUS AND METHOD

(71) Applicant: Taiwan Semiconductor Manufacturing Co., Ltd., Hsinchu (TW)

(72) Inventors: Wei-Chun Yen, Tainan (TW); Chi Yang, Tainan (TW); Sheng-Kang Yu, Hsinchu (TW); Shang-Chieh Chien, New Taipei (TW); Li-Jui Chen, Hsinchu (TW); Heng-Hsin Liu, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/660,862

(22) Filed: May 10, 2024

(65) Prior Publication Data
US 2024/0295825 A1 Sep. 5, 2024

Related U.S. Application Data

(63) Continuation of application No. 17/691,647, filed on Mar. 10, 2022, now Pat. No. 12,007,694.

(60) Provisional application No. 63/270,247, filed on Oct. 21, 2021.

(51) Int. Cl.
*G03F 7/00* (2006.01)
*H05G 2/00* (2006.01)

(52) U.S. Cl.
CPC ...... *G03F 7/70033* (2013.01); *G03F 7/70891* (2013.01); *H05G 2/0092* (2024.08); *H05G 2/0094* (2024.08)

(58) Field of Classification Search
CPC ............. G03F 7/70033; G03F 7/70891; G03F 7/7033; H05G 2/005; H05G 2/008; H05G 2/0094; H05G 2/0092
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |

(Continued)

FOREIGN PATENT DOCUMENTS

| | | |
|---|---|---|
| CN | 108227399 A | 6/2018 |
| TW | I647977 B | 1/2019 |

(Continued)

*Primary Examiner* — Wyatt A Stoffa
*Assistant Examiner* — Hanway Chang
(74) *Attorney, Agent, or Firm* — Slater Matsil, LLP

(57) ABSTRACT

In an embodiment, a method includes: heating a byproduct transport ring of an extreme ultraviolet source, the byproduct transport ring disposed beneath vanes of the extreme ultraviolet source; after heating the byproduct transport ring for a first duration, heating the vanes; after heating the vanes, cooling the vanes; and after cooling the vanes for a second duration, cooling the byproduct transport ring.

20 Claims, 8 Drawing Sheets

(56) References Cited

U.S. PATENT DOCUMENTS

| | | |
|---|---|---|
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 10,162,277 B2 | 12/2018 | Chien et al. |
| 10,859,928 B2 | 12/2020 | Chen et al. |
| 11,172,566 B2 | 11/2021 | Hsiao et al. |
| 12,007,694 B2 * | 6/2024 | Yen ........................ H05G 2/005 |
| 2015/0138519 A1 | 5/2015 | Luijten |
| 2016/0147160 A1 | 5/2016 | Franken |
| 2017/0064799 A1 | 3/2017 | Yabu et al. |

FOREIGN PATENT DOCUMENTS

| | | |
|---|---|---|
| TW | 202013083 A | 4/2020 |
| TW | 202107216 A | 2/2021 |

\* cited by examiner

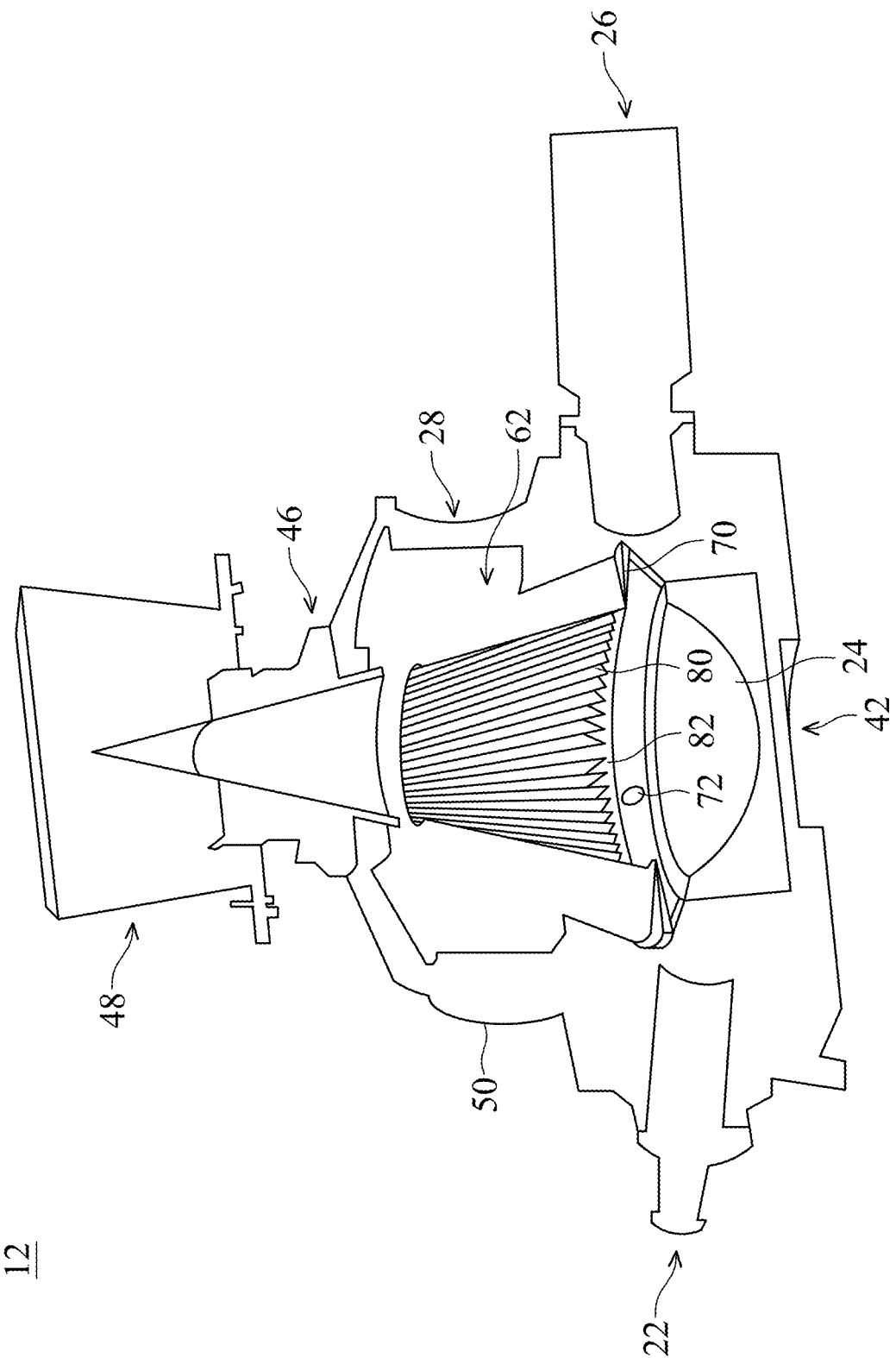

LITHOGRAPHY APPARATUS AND METHOD

PRIORITY CLAIM AND CROSS-REFERENCE

This application is a continuation of U.S. patent application Ser. No. 17/691,647, filed on Mar. 10, 2022, entitled "Lithography Apparatus and Method," which claims the benefit of U.S. Provisional Application No. 63/270,247, filed on Oct. 21, 2021, which applications are hereby incorporated herein by reference.

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2B are detailed views of an extreme ultraviolet (EUV) source, in accordance with some embodiments.

DETAILED DESCRIPTION

Figure 1:
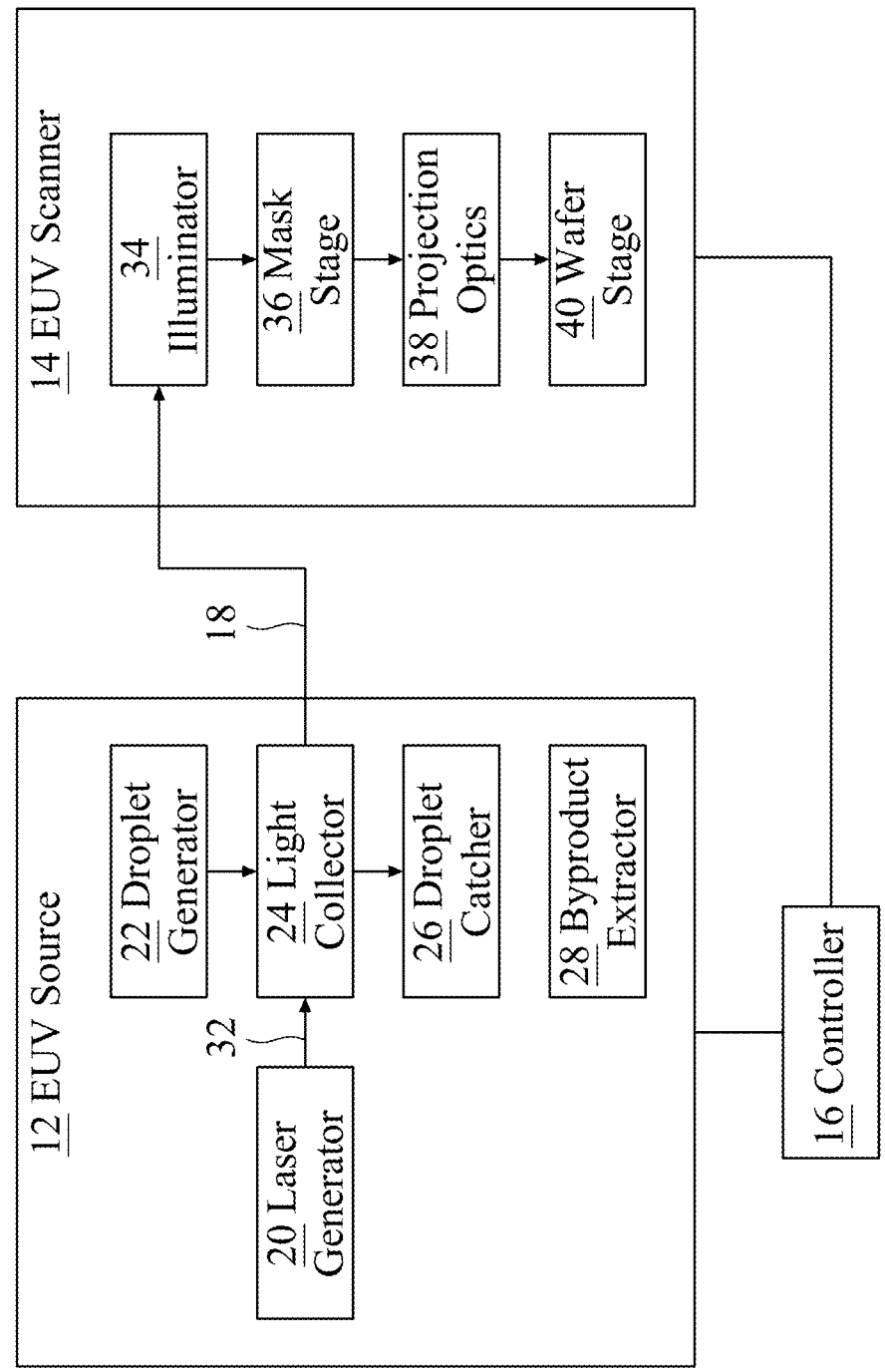
FIG. 1 is a block diagram of a lithography system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a cleaning process is performed to clean plasma generation byproducts from vanes of a lithography system. The cleaning process includes pre-heating lower portions of the vanes to reduce a temperature difference between the lower portions and upper portions of the vanes. Subsequently, the upper and lower portions of the vanes are uniformly heated to melt the byproducts so that the byproducts drip off the vanes and can be evacuated. Pre-heating lower portions of the vanes reduces the time between the upper portions and lower portions of the vanes reaching a desired temperature for melting the byproducts. Reducing the time between the upper portions and lower portions of the vanes reaching the desired temperature reduces the risk of the melted plasma generation byproducts re-solidifying and damaging components of the lithography system.

FIG. 1 is a block diagram of a lithography system 10, in accordance with some embodiments. In some embodiments, the lithography system 10 is an extreme ultraviolet (EUV) lithography system operable to perform photolithography by exposing a resist layer of a wafer to EUV light. The lithography system 10 includes an EUV source 12 for generating EUV light, an EUV scanner 14 for patterning the EUV light and exposing a wafer to the patterned EUV light, and a controller 16 for controlling the components of the lithography system 10.

The EUV source 12 is operable to generate EUV light 18, such as light having a wavelength in the range of 1 nm to 100 nm, such as a wavelength of about 13.5 nm. In some embodiments, the EUV source 12 utilizes a laser-produced plasma (LPP) mechanism to generate the EUV light 18. The EUV source 12 includes a laser generator 20, a droplet generator 22, a light collector 24, a droplet catcher 26, and byproduct extractor 28.

The laser generator 20 is operable to generate a high-intensity laser beam 32. In some embodiments, the laser generator 20 is a carbon dioxide ($CO_2$) laser system. However, it should be appreciated that another type of laser system may be utilized. In some embodiments, the laser beam 32 is generated with an average laser power in the range of 20 kW to 40 kW, and at a frequency in the range of 40 kHz to 100 kHz. Any acceptable laser beam 32 may be generated by the laser generator 20.

The droplet generator 22 is operable to provide droplets of a material for generating a plasma. During operation, the droplets are shot across the light collector 24 and towards the droplet catcher 26. The laser beam 32 from the laser generator 20 is directed toward the droplets as they are shot across the light collector 24. When the laser beam 32 strikes a droplet, the droplet is vaporized, atomized, and ionized such that a plasma is generated. The plasma emits EUV light 18. The selection of the material for the droplets may be made based on a desired wavelength of the EUV light 18. In some embodiments, the material is tin, and the droplet generator 22 may be referred to as a tin droplet generator. Because the laser generator 20, the droplet generator 22, and the droplet catcher 26 work together to generate a plasma, they may be collectively referred to as a plasma generator. The plasma generator generates the plasma above the light collector 24.

The light collector 24 is operable to collect the EUV light 18 emitted when a plasma is generated using the plasma generator (e.g., the laser generator 20, the droplet generator 22, and the droplet catcher 26). When the droplets are ionized, the resulting EUV light 18 is homogeneously scattered such that the EUV light 18 is distributed in all directions. The light collector 24 condenses and focuses the EUV light 18 to form a concentrated beam of the EUV light 18 for a subsequent lithography exposure processes.

The droplet catcher 26 is operable to catch unreacted droplets from the droplet generator 22 for reprocessing. Reprocessing the droplets may include collecting the droplets and returning the collected material to the droplet generator 22 for generating additional droplets. When the material of the droplets is tin, the droplet catcher 26 may be referred to as a tin droplet catcher.

The byproduct extractor 28 is operable to catch and remove byproducts of the plasma generation from the EUV source 12. As will be subsequently described in greater detail, the byproduct extractor 28 is used to perform a cleaning process for removing the byproducts from the EUV source 12 while avoiding damaging to fragile components of the EUV source 12 such as the light collector 24.

The EUV scanner 14 is operable to receive the EUV light 18 from the EUV source 12, pattern the EUV light 18, and expose a resist layer of a wafer to a pattern of the EUV light 18. The resist layer of the wafer is formed of a photosensitive material that is sensitive to the EUV light 18, and the pattern of the EUV light 18 may subsequently be transferred to the wafer by developing the photosensitive material to form a resist pattern and then etching features in the wafer using the resist pattern as an etching mask. The EUV scanner 14 includes an illuminator 34, a mask stage 36, projection optics 38, and a wafer stage 40.

The illuminator 34 is operable to direct the EUV light 18 from the EUV source to the mask stage 36, particularly to a mask secured on the mask stage 36. The illuminator 34 may include reflective optic components, such as a single mirror or a mirror system having multiple mirrors, or refractive optic components, such as a single lens or a lens system having multiple lenses (zone plates). In some embodiments, the illuminator 34 is operable to adjust the reflective optic components to provide off-axis illumination (OAI) to the mask stage 36.

The mask stage 36 is operable to secure a mask on which the EUV light 18 from the illuminator 34 is impinged. In some embodiments, the mask stage 36 includes an electrostatic chuck for securing the mask. The mask secured to the mask stage 36 includes reflective layers. The reflective layers are reflective of the EUV light 18, and define a pattern of a layer of an integrated circuit (IC). When the EUV light 18 is impinged on the mask secured to the mask stage 36, the EUV light 18 is reflected by the reflective layers, and the reflected EUV light 18 has a pattern of the mask.

The projection optics 38 are operable to collect the patterned EUV light 18 from the mask secured to the mask stage 36, and project the patterned EUV light 18 onto the wafer stage 40, particularly to a wafer secured on the wafer stage 40. The projection optics 38 may magnify the patterned EUV light 18. In some embodiments, the projection optics 38 magnify the patterned EUV light 18 with a magnification of less than one, thereby reducing the size of the patterned EUV light 18. The projection optics 38 may include refractive or reflective optics.

The wafer stage 40 is operable to secure a wafer on which the patterned EUV light 18 from the projection optics 38 is impinged. In some embodiments, the wafer stage 40 includes an electrostatic chuck for securing the wafer. The wafer may be, for example, a semiconductor wafer, such as a silicon wafer or other type of wafer to be patterned.

The controller 16 is connected to the components of the lithography system 10, and is operable to control the components of lithography system 10. Specifically, the controller 16 is operable to control the lithography system 10 to perform lithography process(es) and to perform cleaning process. The controller 16 may be used to store and control parameters associated with the operation of the EUV source 12 and the EUV scanner 14. The controller 16 may be implemented in either hardware or software, and the parameters may be hardcoded or input to the controller 16 through an input device. For example, the controller 16 may include a processor and a non-transitory computer readable storage medium storing programming for execution by the processor, where the programming includes instructions for controlling the components of the EUV source 12. Similarly, the controller 16 may include a circuit such as an application-specific integrated circuit (ASIC), a field-programmable gate array (FPGA), or the like for controlling the components of the EUV source 12. As will be subsequently described in greater detail, the cleaning process performed by the controller 16 includes controlling the byproduct extractor 28 to catch and remove plasma generation byproducts from the EUV source 12 while avoiding damaging to fragile components of the EUV source 12.

Figure 2A:
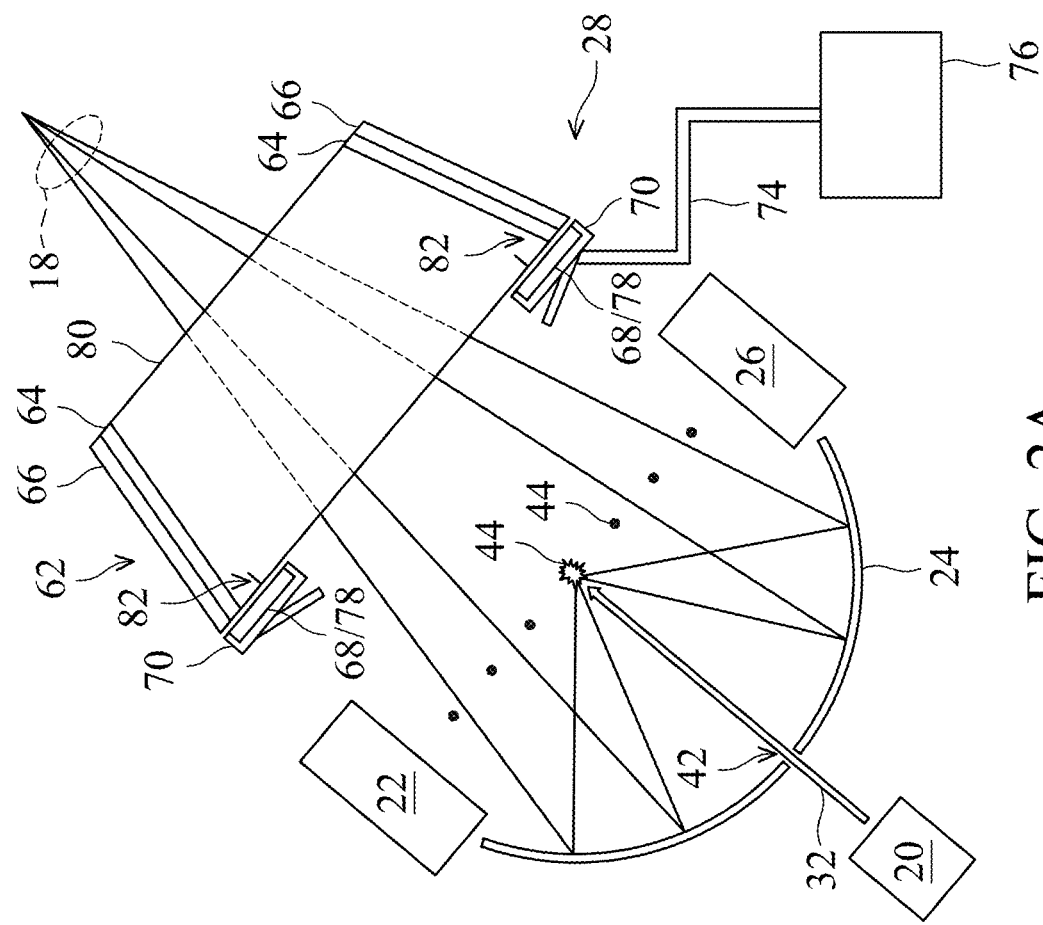

FIGS. 2A-2B are detailed views of an EUV source 12, in accordance with some embodiments. FIG. 2A is a schematic diagram of the EUV source 12 in operation. FIG. 2B is a three-dimensional cutaway view of the EUV source 12. Some features have been omitted from the views for illustration clarity.

The EUV source 12 further includes a window 42 to receive the laser beam 32. The window 42 extends through a bottom of the light collector 24. The laser beam 32 is directed through the window 42 from the laser generator 20 (see FIG. 1). The laser beam 32 is directed from the laser generator 20 to the window 42 by a beam delivery system, such as one or more mirrors which are operable to convey the laser beam 32 by reflecting the laser beam 32 in a desired direction. The window 42 includes a suitable material substantially transparent to the laser beam 32.

The light collector 24 is designed with a coating material and shape to function as a mirror for generated EUV light 18. In some embodiments, the light collector 24 has an ellipsoidal shape. In some embodiments, the outer diameter of the light collector 24 is in the range of 400 mm to 600 mm, and the window 42 has a diameter in the range 30 mm to 150 mm. Other shapes and/or sizes may be used for the light collector 24 and the window 42. In some embodiments, the coating material of the light collector 24 includes multiple reflective layers, such as a plurality of molybdenum-silicon film pairs (e.g., a layer of molybdenum above or below a layer of silicon in each film pair). The light collector 24 may further include a capping layer (such as a layer of ruthenium) coated on the multiple reflective layers to substantially reflect the EUV light 18. In some embodiments, the light collector 24 may further include a grating structure designed to effectively scatter any of the laser beam 32 which may reach the surface of the light collector 24. For example, a silicon nitride layer may be coated on the light collector 24 and may be patterned to have a grating pattern.

The EUV source 12 further includes a lower cone 46 and an intermediate focus (IF) module 48. The lower cone 46 may include a treated surface which further directs the EUV light 18 to the IF module 48. The IF module 48 is operable to provide intermediate focus of the EUV light 18 to convey the EUV light 18 to the EUV scanner 14 (see FIG. 1). The IF module 48 may include, for example, an IF-cap quick-connect module, for providing the EUV light 18 to a scanner.

As described above, when the laser beam 32 strikes a droplet 44 from the droplet generator 22, EUV light 18 is generated. The laser beam 32 from the laser generator 20 is generated in pulses and is synchronized to enter through the window 42 to strike the droplet 44 when positioned in the path of the laser beam 32 to receive peak power from the laser generator 20. When the laser beam 32 strikes the droplet 44, the droplet 44 is vaporized, atomized, and ionized to create a plasma, resulting in EUV radiation and droplet byproducts. The droplet byproducts are created as a result of the droplet 44 being vaporized or atomized. These byproducts are scattered during generation, such that they would be distributed on components of the EUV source 12 (e.g., the window 42 and the lower cone 46) if their generation were unmitigated. As noted above, the droplets 44 may be tin droplets. Tin contaminates on the window 42 and the lower cone 46 would reduce the efficiency of the EUV source 12. The byproduct extractor 28 (see FIG. 1) is operable to catch the droplet byproducts when they are generated so that they are not distributed on the components of the EUV source 12, thereby improving the efficiency of the EUV source 12. The byproduct extractor 28 includes a vane structure 62, heater(s) 64, cooler(s) 66, a byproduct transport ring 68, a heat shield 70, a drain line 74, and a collector 76.

The vane structure 62 includes vanes 80 and a gutter 82. The vanes 80 protrude from the sidewalls of the vane structure 62, and extend along the sidewalls of the vane structure 62 in a direction parallel to direction in which the EUV light 18 is directed. As will be subsequently described for FIG. 3C, the vanes 80 may be V-shaped. The gutter 82 is disposed beneath the vanes 80. The vane structure 62 may be a machined structure formed of a metal. During operation, the vanes 80 catch the generated droplet byproducts. A cleaning process may be performed between lithography process(es) to clean the byproducts distributed on the vanes 80. As will be subsequently described in greater detail, the vanes 80 are heated during the cleaning process to melt and recover material, such as tin, that collects on the vanes 80 during the lithography process(es). When heated, the byproducts run down the vanes 80 and drip into the gutter 82. The light collector 24 is a precise device that is expensive to replace, and so contamination of the light collector 24 is undesirable. According to various embodiments, the byproduct extractor 28 performs the cleaning process for removing the droplet byproducts from the vanes 80 in a manner that increases the chances of the droplet byproducts dripping into the gutter 82 instead of onto the light collector 24. Damage to the light collector 24 during the cleaning process may thus be avoided, increasing the lifespan of the EUV source 12.

The heater(s) 64 are disposed around the vanes 80. The heater(s) 64 may include a plurality of heating elements which are periodically disposed around the vane structure 62, or a single heating element which extends continuously around the vane structure 62. In some embodiments, the heater(s) 64 include heater rod(s), such as resistive heating element(s) or the like.

The cooler(s) 66 are disposed around the heater(s) 64. The cooler(s) 66 may include a plurality of cooling elements which are periodically disposed around the vane structure 62, or a single cooling element which extends continuously around the vane structure 62. In some embodiments, the cooler(s) 66 include cooling element(s), such as water cooling pipe(s), thermoelectric cooler(s), or the like.

The byproduct transport ring 68 is disposed beneath the vane structure 62, and particularly beneath the gutter 82. Thus, the byproduct transport ring 68 is above the light collector 24. In some embodiments, the byproduct transport ring 68 has an annular shape, so that the byproduct transport ring 68 extends around the bottom footprint of the vane structure 62 while still allowing the EUV light 18 to pass therethrough. As will be subsequently described in greater detail, the byproduct transport ring 68 is operable to collect byproducts that drip into the gutter 82 during a cleaning process for the vanes 80, so that the byproducts may be transported to the collector 76. To prevent the byproducts from solidifying during transportation, the byproduct transport ring 68 includes a heater 78 (not separately illustrated), which is operable to heat the byproduct transport ring 68 during operation so that the byproducts remain in the liquid phase. For example, the heater 78 may be a resistive heating element which extends around and through a core of the byproduct transport ring 68.

The heat shield 70 is disposed beneath the byproduct transport ring 68. The heat shield 70 is formed of a material which is resistant to heat, and is operable to protect the underlying components (e.g., the light collector 24) from heat when the byproduct transport ring 68 is heated. In some embodiments, the heat shield 70 includes a channel for holding and supporting the byproduct transport ring 68. The channel in the heat shield 70 has the same shape as the byproduct transport ring 68 (e.g., an annular shape). Openings 72 in the heat shield 70 and the byproduct transport ring 68 allow the byproducts in the byproduct transport ring 68 to drip into a drain line 74 and flow through to the collector 76.

The drain line 74 is operable to carry the byproducts from the byproduct transport ring 68 to the collector 76. The collector 76 is operable to store the byproducts. The drain line 74 and the collector 76 may be formed of a material which is substantially chemically inert to the byproducts, such as polyvinyl chloride (PVC) or the like. The drain line 74 connects the heat shield 70 to the collector 76, and may extend through the openings 72.

Some or all of the components of the EUV source 12 are disposed in a processing chamber 50. In some embodiments, the processing chamber 50 is maintained at a vacuum during processing. Air absorbs some types of light, and so maintaining the processing chamber 50 at a vacuum may increase processing efficiency.

According to various embodiments, a cleaning process for the vanes 80 is performed between lithography process(es) to remove byproducts from the vanes 80. The cleaning process includes a heating cycle and a cooling cycle. During the heating cycle, the vanes 80 are heated using the heater(s) 64 and the byproduct transport ring 68 so that byproducts collected on the vanes 80 melt and run down the vanes 80. The melted byproducts drip into the gutter 82, onto the byproduct transport ring 68, and then into the drain line 74 (see FIG. 2A) so that they ultimately flow to the collector 76

(see FIG. 2A). During the cooling cycle, the vanes 80 are cooled using the cooler(s) 66 so that they may be safely operated again.

Figure 3B:
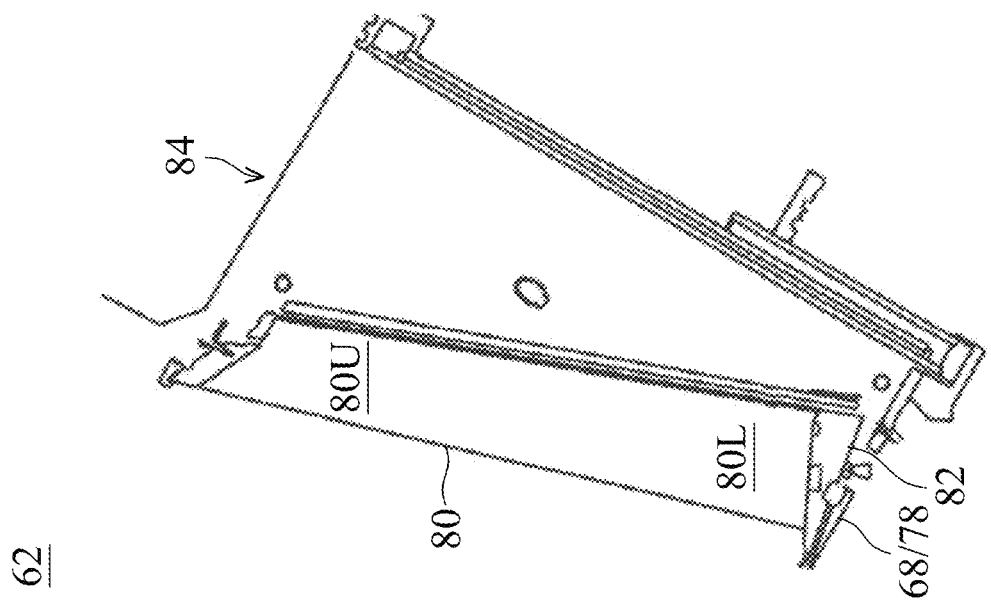
FIGS. 3A-3C are views of a portion of a vane structure, in accordance with some embodiments.
Figure 3A:
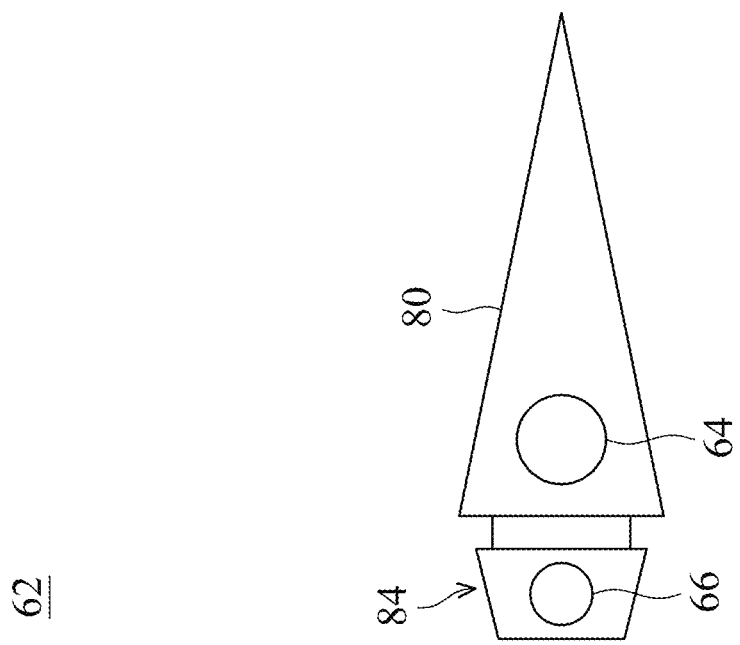
Figure 3C:
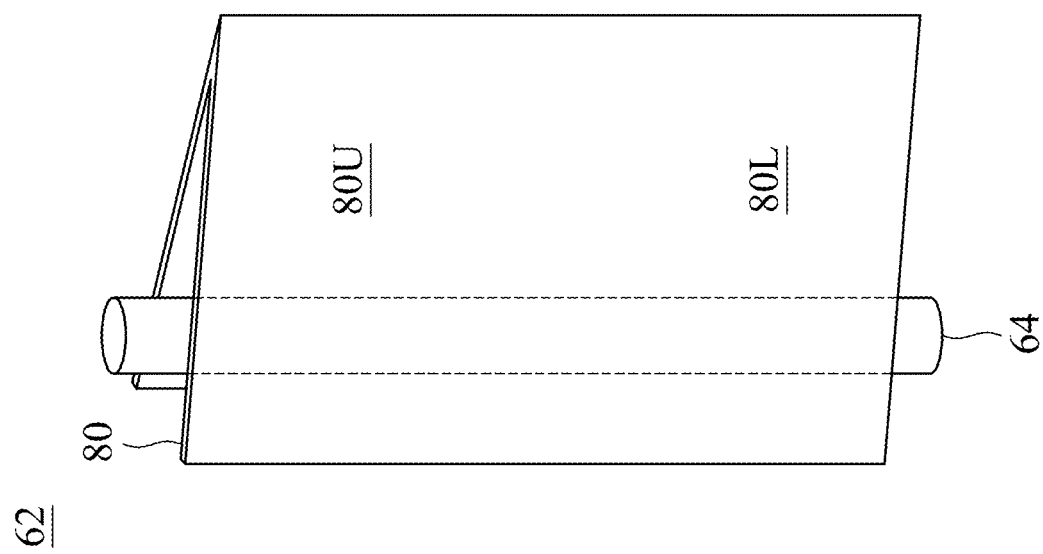

FIGS. 3A-3C are views of a portion of a vane structure 62, in accordance with some embodiments. FIG. 3A is a schematic top-down view of the portion of the vane structure 62. FIG. 3B is a schematic side view of the portion of the vane structure 62. FIG. 3C is a three-dimensional view of the portion of the vane structure 62. Some features have been omitted from the views for illustration clarity.

The vane structure 62 further includes an attachment structure 84 for each vane 80. The attachment structure 84 attaches the vane 80 to the sidewall of the vane structure 62 (e.g., to the main structure of the vane structure 62). The attachment structure 84 may include, e.g., a hinge which is physically coupled to the vane 80 and to the sidewall of the vane structure 62, such that the vane 80 is operable to swing around the hinge. In some embodiments, the attachment structure 84 further includes a motor for actuating the vane 80 to move it during operation.

In the illustrated embodiment, the heater(s) 64 include a plurality of heating elements and the cooler(s) 66 include a plurality of cooling elements. Specifically, a heater 64 and a cooler 66 are disposed in each vane structure 62, such that each vane 80 is capable of being individually heated and cooled. For example, the heater 64 for a vane 80 may extend along the length of the vane 80, and the cooler 66 for a vane 80 may extend along the length of the attachment structure 84. During operation (e.g., a cleaning process), heat is transferred from the heater 64 to the vane 80 during the heating cycle of the cleaning process, and heat is transferred from the vane 80 to the cooler 66 during the cooling cycle of the cleaning process. In embodiments where the cooler 66 is a cooling pipe disposed in the attachment structure 84, heat may be transferred from the vane 80 to the cooler 66 by flowing water through the cooling pipe such that heat is carried away from the attachment structure 84 and the vane 80 by conduction. As shown in FIG. 3C, a vane 80 may be v-shaped (e.g., the sidewalls of the vane 80 form a V), with the heater 64 for the vane 80 disposed in the hollow region formed by the sidewalls of the vane 80. In such embodiments, heat is transferred from the heater 64 to the vane 80 by radiation or convection.

As noted above, a cleaning process is performed to remove byproducts from the vanes 80. The heater(s) 64 are used to heat the vanes 80 during the cleaning process, and provide substantially uniform heating. However, heat is generated during lithography process(es), and most of the generated heat is applied on the top of the vane structure 62 and the lower cone 46 (see FIG. 2B). Thus, during lithography process(es) and at the beginning of the cleaning process, the upper portions 80U of the vanes 80 are warmer than the lower portions 80L of the vanes 80. As a result, if only the heater(s) 64 were used to heat the vanes 80, the upper portions 80U of the vanes 80 would reach a desired temperature before the lower portions 80L of the vanes 80. The temperature of the upper portions 80U of the vanes 80 (also referred to as the upper temperature of the vanes 80) would thus be greater than the melting point of the byproducts, while the temperature of the lower portions 80L of the vanes 80 (also referred to as the lower temperature of the vanes 80) would still be below the freezing point of the byproducts. According to various embodiments, the byproduct transport ring 68 is also heated during the heating cycle of the cleaning process, and is heated before the heater(s) 64 are turned on. Because the byproduct transport ring 68 is disposed beneath the vanes 80, heating the byproduct transport ring 68 heats the lower portions 80L of the vanes 80. Specifically, heat is transferred from the byproduct transport ring 68 to the vane 80 by radiation, convection, or conduction. The amount of heating performed using the byproduct transport ring 68 is controlled to reduce the temperature difference between the upper portions 80U and lower portions 80L of the vanes 80 before the heater(s) 64 are used to heat the vanes 80. The byproduct transport ring 68 and the heater(s) 64 may then both be used to heat the vanes 80, allowing the vanes 80 to be heated more uniformly, thereby reducing the time between the upper portions 80U and lower portions 80L of the vanes 80 reaching a desired temperature (e.g., the melting point of the byproducts). More uniformly heating the vanes 80 advantageously reduces the amount of time when melted byproducts could run down the upper portions 80U of the vanes 80 and re-solidify upon reaching the lower portions 80L of the vanes 80. Re-solidifying of byproducts on the lower portions 80L of the vanes 80 would lead to merging and accumulation of the byproducts, eventually resulting in the accumulated byproducts detaching from the lower portions 80L of the vanes 80, potentially falling onto and damaging the light collector 24 (see FIGS. 2A-2B). More uniformly heating the vanes 80 during the cleaning process can reduce the risk of damage to the light collector 24, increasing the lifespan of the EUV source 12.

Figure 4:
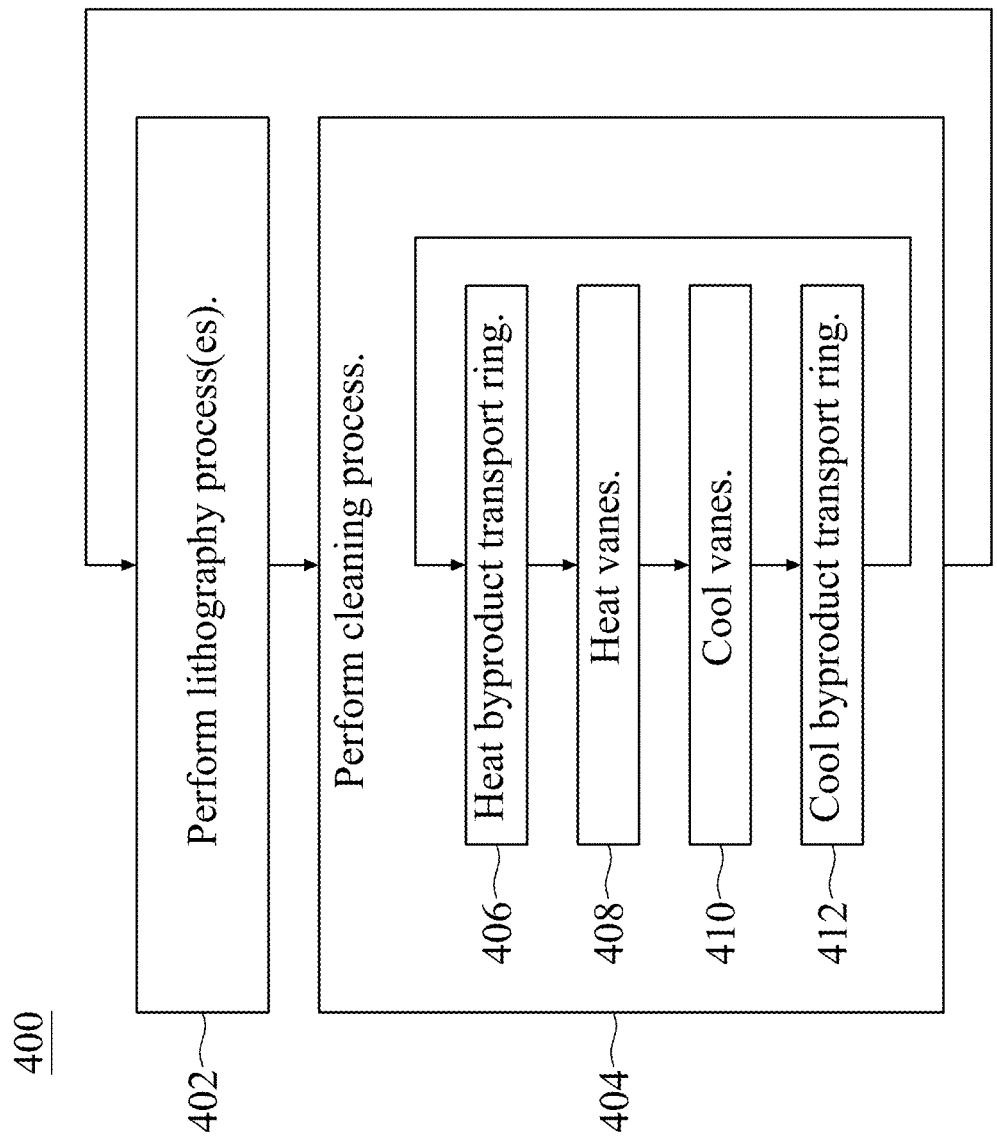
FIG. 4 is a flow chart of a method for operating a lithography system, in accordance with some embodiments.

FIG. 4 is a flow chart of a method 400 for operating the lithography system 10, in accordance with some embodiments. The method 400 may be performed by, e.g., the controller 16 (see FIG. 1). The controller 16 may perform the method 400 by controlling the components of the lithography system 10, and so the components described for FIGS. 1-3C are referred to when describing the method 400.

In step 402, one or more lithography process(es) are performed to process one or more semiconductor wafer(s). The lithography process(es) are performed by securing a wafer on the wafer stage 40, and by securing a mask for the wafer on the mask stage 36. The EUV light 18 is then generated using the EUV source 12, and scanned on the wafer using the EUV scanner 14. The wafer is coated with a resist layer sensitive to the EUV light 18. The resist layer may be formed of a positive tone resist or a negative tone resist. The resist layer may be a photoresist, which may be formed on the target substrate by spin-on coating, soft baking, or combinations thereof. The wafer processing may be repeated as many times as desired. During the lithography process(es), the temperature of the vanes 80 is below a predetermined value. The predetermined value is less than or equal to the melting point of the plasma generation byproducts, so that any byproducts which accumulate on the vanes 80 during the lithography process(es) remain solid and do not melt. For example, when the droplets 44 are tin, the temperature of the vanes 80 is below the melting point of tin. In some embodiments, the predetermined value is 140° C.

In step 404, a cleaning process is performed to clean byproducts from the EUV source 12. The cleaning process includes heating the vanes 80 of the vane structure 62 until the byproducts on the vanes 80 melt, and then evacuating the melted byproducts from the vane structure 62 (e.g., from the processing chamber 50). Heating the vanes 80 includes pre-heating the lower portions 80L of the vanes 80 using the byproduct transport ring 68, and subsequently heating the upper portions 80U and lower portions 80L of the vanes 80 together using the heater(s) 64. The upper portions 80U of the vanes 80 are not heated (or are heated less than the lower portions 80L of the vanes 80) during the pre-heating. During the cleaning process, the temperature of the vanes 80 is above the predetermined value described for step 402. The vanes 80 are then cooled, and the heating/cooling cycles are repeated a desired quantity of times. Each of these steps will be described in greater detail. After the cleaning process, the lithography process(es) may be performed again.

In step 406, the byproduct transport ring 68 is heated. The byproduct transport ring 68 may be heated by turning on the heater (not separately illustrated) inside the byproduct transport ring 68. For example, when the byproduct transport ring 68 includes a heater 78, such as a resistive heating element, the byproduct transport ring 68 may be heated by providing current to the resistive heating element. The byproduct transport ring 68 is heated for a predetermined duration, until it is a predetermined temperature. In some embodiments, the byproduct transport ring 68 is heated for a duration in the range of 3 hours to 4 hours, until it is at a temperature in the range of 100° C. to 500° C. Heating the byproduct transport ring 68 to a temperature of less than 100° C. may cause the formation of tin wool. Other acceptable durations or temperatures may be utilized when heating the byproduct transport ring 68. As noted above, heat is transferred from the byproduct transport ring 68 to the lower portions 80L of the vanes 80. As such, heating the byproduct transport ring 68 results in heating of the lower portions 80L of the vanes 80. Thus, heating the byproduct transport ring 68 reduces the temperature difference between the upper portions 80U and lower portions 80L of the vanes 80. Both the byproduct transport ring 68 and the lower portions 80L of the vanes 80 are heated to a temperature that is less than the melting point of the byproducts on the vanes 80 during pre-heating, such that the byproducts are not melted when reducing the temperature difference between the upper portions 80U and lower portions 80L of the vanes 80.

In some embodiments, the byproduct transport ring 68 is heated at a single continuous heating rate. For example, the heater 78 of the byproduct transport ring 68 may maintained at a fixed temperature, which causes the byproduct transport ring 68 to be heated at a continuous heating rate. When the heater 78 is a resistive heating element, it may be maintained at a fixed temperature by providing a constant current to the resistive heating element. In some embodiments, the heater 78 of the byproduct transport ring 68 is maintained at a temperature in the range of 100° C. to 600° C., thereby causing the byproduct transport ring 68 to heat at a rate in the range of 60° C./hour to 500° C./hour.

In some embodiments, the byproduct transport ring 68 is heated at multiple heating rates of increasing value. For example, the heater 78 of the byproduct transport ring 68 may be heated with a heating gradient that increases. When the heater 78 is a resistive heating element, it may be heated with a heating gradient by providing an increasing current to the resistive heating element. In some embodiments, the heater 78 of the byproduct transport ring 68 is gradually increased from an initial temperature in the range of 100° C. to 200° C., to a final temperature in the range of 200° C. to 500° C.

In step 408, the vanes 80 are heated. The vanes 80 may be heated by turning on the heater(s) 64 and turning off the cooler(s) 66 (if they are on). For example, when the heater(s) 64 are resistive heating element(s), the heater(s) 64 may be heated by providing current to the resistive heating element. The vanes 80 are heated for a predetermined duration, until they are a predetermined temperature. In some embodiments, the vanes 80 are heated for a duration in the range of 1 hours to 2 hours, until the upper portions 80U of the vanes 80 are at a temperature in the range of 200° C. to 350° C. and until the lower portions 80L of the vanes 80 are at a temperature in the range of 150° C. to 350° C. Heating the vanes 80 to a temperature of less than 100° C. may cause the formation of tin wool. Other acceptable durations or temperatures may be utilized when heating the vanes 80. The lower portions 80L of the vanes 80 may be heated to a lower temperature than the upper portions 80U of the vanes 80. Both the upper portions 80U and lower portions 80L of the vanes 80 are heated to a temperature that is greater than the melting point of the byproducts on the vanes 80.

The heating of the vanes 80 does not begin until after the byproduct transport ring 68 has heated for a desired duration. Specifically, a wait is performed between the heating of the byproduct transport ring 68 and the heating of the vanes 80, such that the byproduct transport ring 68 is heated for a predetermined duration before the heating of the vanes 80 begins. In some embodiments, the byproduct transport ring 68 is heated for a duration in the range of 0.5 hours to 1.0 hour before beginning the heating of the vanes 80. Other acceptable wait times may be utilized. As a result, the byproduct transport ring 68 is pre-heated for a first duration of time, and then the vanes 80 and the byproduct transport ring 68 are heated together for a second duration of time. Thus, the temperature difference between the upper portions 80U and lower portions 80L of the vanes 80 is reduced before the vanes 80 are heated by the heater(s) 64.

In step 410, the vanes 80 are cooled. The vanes 80 may be cooled by turning off the heater(s) 64 and turning on the cooler(s) 66. For example, when the cooler(s) 66 are water cooling pipe(s), the cooler(s) 66 may be cooled by flowing water through the cooling pipe(s). The vanes 80 are cooled for a predetermined duration, until they are a predetermined temperature. In some embodiments, the vanes 80 are cooled for a duration in the range of 0.2 hours to 0.5 hours, until the upper portions 80U of the vanes 80 are at a temperature in the range of 100° C. to 300° C. and until the lower portions 80L of the vanes 80 are at a temperature in the range of 100° C. to 200° C. Cooling the vanes 80 to a temperature of less than 100° C. may cause the formation of tin wool. Other acceptable durations or temperatures may be utilized when cooling the vanes 80. Both the upper portions 80U and lower portions 80L of the vanes 80 are cooled to a temperature that is less than the melting point of subsequently formed plasma generation byproducts.

In step 412, the byproduct transport ring 68 is cooled. The byproduct transport ring 68 may be cooled by turning off the heater (not separately illustrated) inside the byproduct transport ring 68. Thus, the lower portions 80L of the vanes 80 are cooled alone, without cooling the upper portions 80U of the vanes 80. The byproduct transport ring 68 is cooled for a predetermined duration, until it is a predetermined temperature. In some embodiments, the byproduct transport ring 68 is cooled for a duration in the range of 0.1 hours to 0.3 hours, until it is at a temperature in the range of 100° C. to 300° C. Cooling the byproduct transport ring 68 to a temperature of less than 100° C. may cause the formation of tin wool. Other acceptable durations or temperatures may be utilized when cooling the byproduct transport ring 68. The byproduct transport ring 68 is cooled to a temperature that is less than the melting point of subsequently formed plasma generation byproducts.

The cooling of the byproduct transport ring 68 does not begin until after the vanes 80 have cooled for a desired duration. Specifically, a wait is performed between the cooling of the vanes 80 and the cooling of the byproduct transport ring 68, such that the vanes 80 are cooled for a predetermined duration before the cooling of the byproduct transport ring 68 begins. In some embodiments, the vanes 80 are cooled for a duration in the range of 0.5 hours to 1.0 hour before beginning the cooling of the byproduct transport ring 68. Other acceptable wait times may be utilized. As a result, the vanes 80 are pre-cooled for a first desired duration, and then the byproduct transport ring 68 is cooled for a second desired duration.

After the vanes 80 have cooled, the heating and cooling cycles may be repeated a desired quantity of times. Each cycle of heating and cooling is referred to as a thermal cycle. In some embodiments, about 5/6 of a thermal cycle is spent performing cooling and about 1/6 of a thermal cycle is spent performing heating. Any desired amount of heating and cooling may be performed for each thermal cycle. Utilizing shorter thermal cycles may be more costly, but reduces the risk of damage to the light collector 24.

Figure 5:
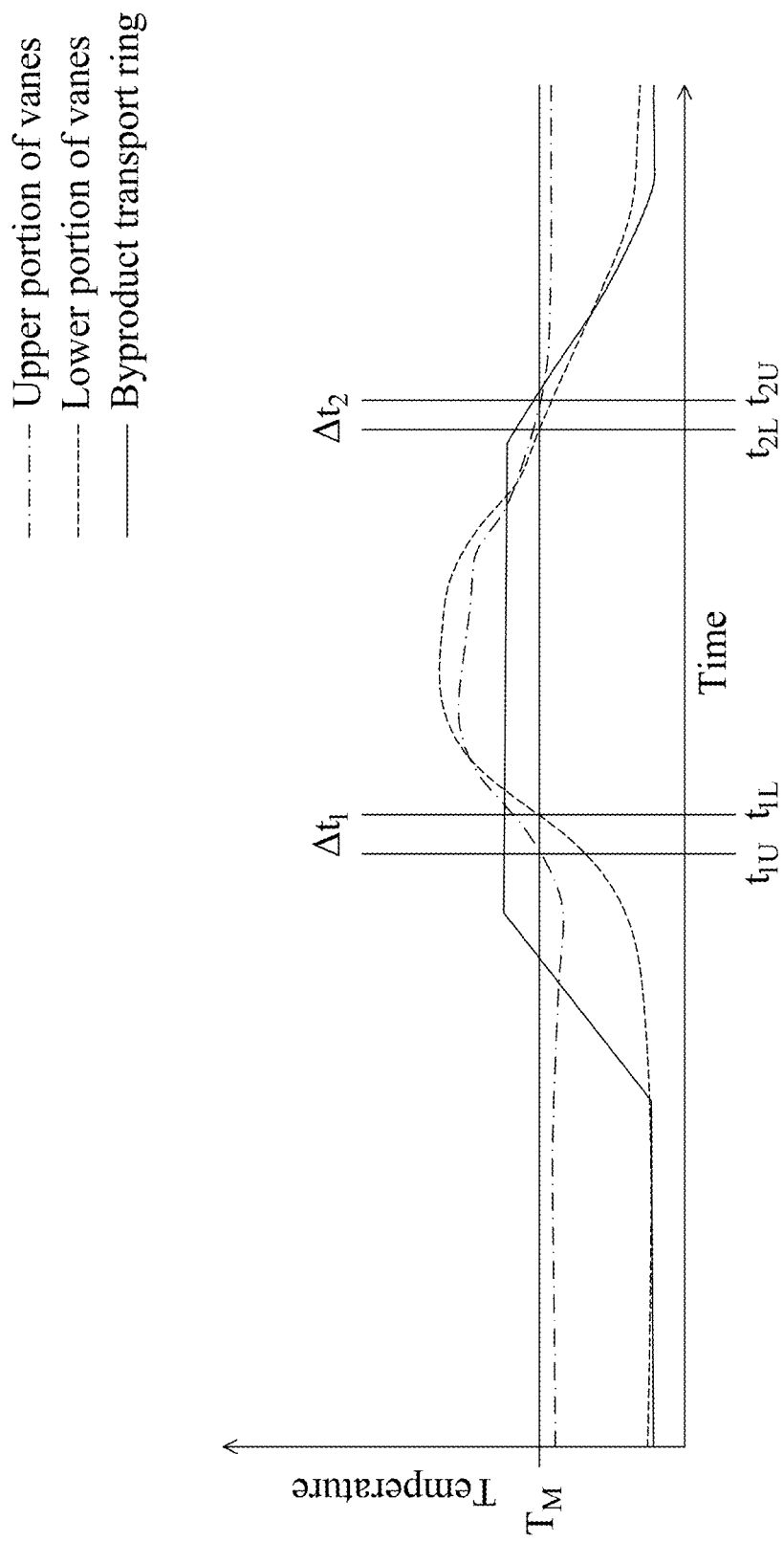
FIG. 5 is a temperature chart for components of a lithography system during a cleaning process, in accordance with some embodiments.
Figure 6:
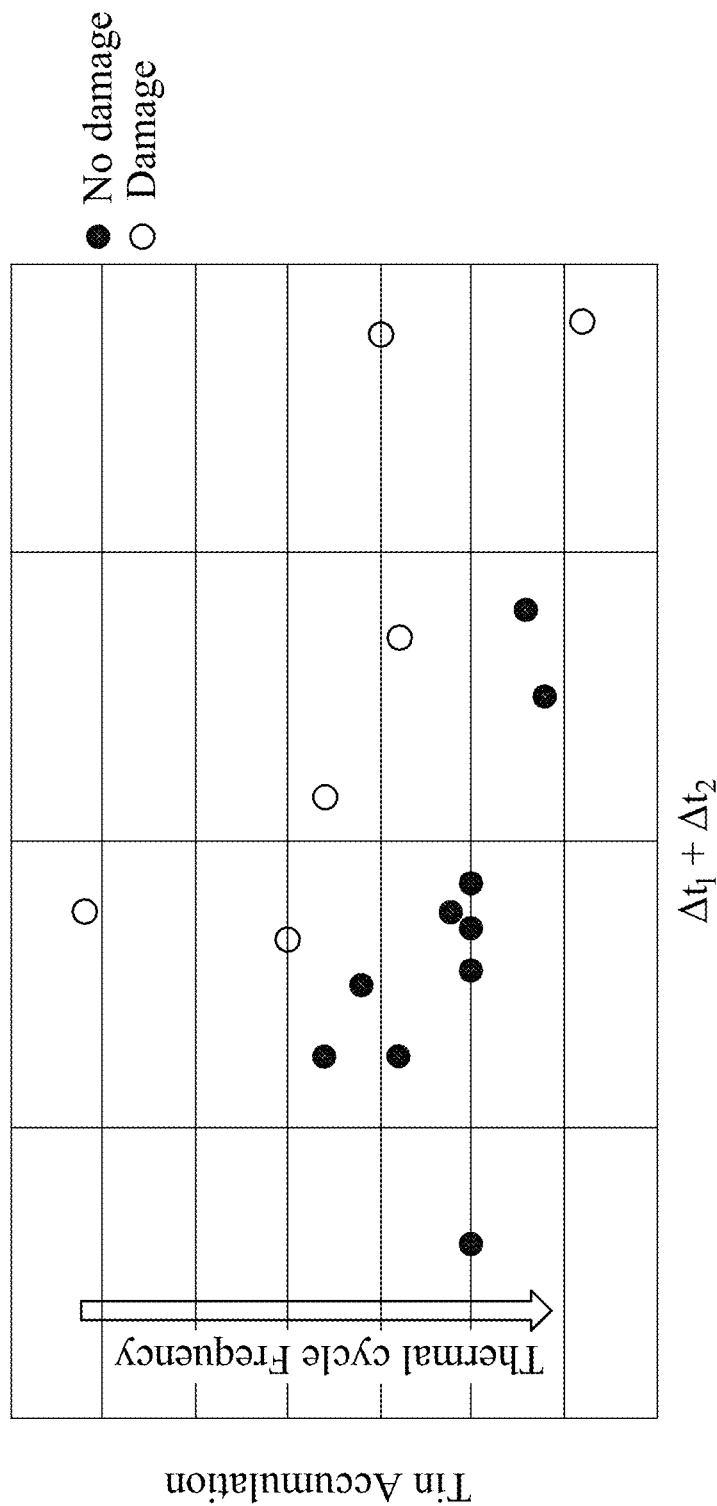
FIG. 6 illustrates experimental data for a lithography system, in accordance with some embodiments.

FIG. 5 is a temperature chart for the components of the lithography system during a cleaning process, in accordance with some embodiments. Temperature of the components is plotted against time. As shown, the temperature of the upper portions 80U and lower portions 80L of the vanes 80 exceeds the melting point $T_M$ of the byproducts at times $t_{1U}$ and $t_{1L}$, respectively. As a result of pre-heating the byproduct transport ring 68, the difference $\Delta t_1$ between the times $t_{1U}$ and $t_{1L}$ is reduced. In some embodiments, the time difference $\Delta t_1$ is in the range of 5 minutes to 30 minutes. Reducing the time difference $\Delta t_1$ reduces the risk of damage to the light collector 24 during the cleaning process. As further shown, the temperature of the upper portions 80U and lower portions 80L of the vanes 80 falls below the melting point $T_M$ of the byproducts at times $t_{2U}$ and $t_{2L}$, respectively. As a result of pre-cooling the vanes 80, the difference $\Delta t_2$ between the times $t_{2U}$ and $t_{2L}$ is reduced. In some embodiments, the time difference $\Delta t_2$ is in the range of 15 minutes to 60 minutes. Reducing the time difference $\Delta t_2$ reduces the risk of damage to the light collector 24 during the cleaning process. FIG. 6 illustrates experimental data for a lithography system, in accordance with some embodiments. As can be seen, the risk of damage to the light collector 24 decreased with decreasing values of the sum of $\Delta t_1$ and $\Delta t_2$.

Embodiments may achieve advantages. Pre-heating the byproduct transport ring 68 during the heating cycle of the cleaning process reduces the temperature difference between the upper portions 80U and lower portions 80L of the vanes 80. This reduces the time between the upper portions 80U and lower portions 80L of the vanes 80 reaching a desired temperature (e.g., the melting point of plasma generation byproducts) when the vanes 80 are subsequently heated during the heating cycle of the cleaning process. Reducing the time between the upper portions 80U and lower portions 80L of the vanes 80 reaching the desired temperature reduces the risk of the plasma generation byproducts re-solidifying and falling on the light collector 24 during the cleaning process. The lifespan of the EUV source 12 may thus be increased. In an experiment, the availability of a lithography system was improved by from 20% to 40%, the maintenance time for the lithography system was reduced to be in the range of 24 hours to 48 hours, and the lifespan of the light collector 24 was increased to be in the range of 20 days to 45 days.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

In an embodiment, a method includes: heating a byproduct transport ring of an extreme ultraviolet source, the byproduct transport ring disposed beneath vanes of the extreme ultraviolet source; after heating the byproduct transport ring for a first duration, heating the vanes; after heating the vanes, cooling the vanes; and after cooling the vanes for a second duration, cooling the byproduct transport ring. In some embodiments of the method, heating the byproduct transport ring reduces a temperature difference between upper portions of the vanes and lower portions of the vanes. In some embodiments of the method, heating the byproduct transport ring includes heating the byproduct transport ring at a single continuous heating rate. In some embodiments of the method, heating the byproduct transport ring includes heating the byproduct transport ring at multiple heating rates of increasing value. In some embodiments, the method further includes: generating a plasma with the extreme ultraviolet source, a byproduct of the plasma being distributed on the vanes during generation of the plasma, where the byproduct transport ring is heated to a first temperature, the first temperature less than a melting point of the byproduct, and where the vanes are heated to a second temperature, the second temperature greater than the melting point of the byproduct. In some embodiments of the method, generating the plasma includes: generating a droplet of a material; and striking the droplet with a laser beam, the droplet being vaporized, atomized, and ionized to create the plasma. In some embodiments of the method, the material is tin. In some embodiments of the method, the first duration is in a range of 0.5 hours to 1.0 hour and the second duration is in a range of 0.5 hours to 1.0 hour.

In an embodiment, a method includes: generating a plasma in a processing chamber by striking a tin droplet with a laser beam, a byproduct of the tin droplet distributed on a vane in the processing chamber, an upper temperature of an upper portion of the vane being greater than a lower temperature of a lower portion of the vane during generation of the plasma; reducing a difference between the upper temperature and the lower temperature by heating the lower portion of the vane; after reducing the difference between the upper temperature and the lower temperature, melting the byproduct of the tin droplet on the vane by heating the upper portion of the vane and the lower portion of the vane; and evacuating the melted byproduct of the tin droplet from the processing chamber. In some embodiments of the method, heating the lower portion of the vane includes: heating a byproduct transport ring disposed beneath the vane. In some embodiments of the method, heating the byproduct transport ring includes: providing a constant current to a heating element of the byproduct transport ring. In some embodiments of the method, heating the byproduct transport ring includes: providing an increasing current to a heating element of the byproduct transport ring. In some embodiments of the method, the byproduct of the tin droplet is not melted during the reducing the difference between the upper temperature and the lower temperature. In some embodiments of the method, heating the upper portion of the vane and the lower portion of the vane includes: turning on a heating element, the heating element extending along a length of the vane. In some embodiments, the method further includes: after evacuating the byproduct of the tin droplet from the processing chamber, cooling the upper portion of the vane and the lower portion of the vane; and after cooling the upper portion of the vane and the lower portion of the vane, cooling the lower portion of the vane without cooling the upper portion of the vane.

In an embodiment, an apparatus includes: a plasma generator; a light collector; a byproduct transport ring above the light collector, the byproduct transport ring including a first heating element; a vane above the byproduct transport ring; a second heating element extending along a length of the vane; a controller configured to: generate a plasma above the light collector with the plasma generator, a plasma generation byproduct distributed on the vane; heat the first heating element of the byproduct transport ring to reduce a temperature difference between an upper portion and a lower portion of the vane; and after reducing the temperature difference, heat the second heating element to melt the plasma generation byproduct distributed on the vane. In some embodiments, the apparatus further includes: a drain line extending through an opening in the byproduct transport ring; and a collector connected to the drain line, the plasma generation byproduct being evacuated to the collector through the drain line when melted. In some embodiments, the apparatus further includes: a heat shield having a channel holding the byproduct transport ring, the drain line extending through an opening in the heat shield. In some embodiments of the apparatus, the plasma generator includes: a droplet generator configured to provide droplets of a material; a laser generator configured to generate a laser beam that ionizes the droplets of the material to generate the plasma; and a droplet catcher configured to catch unreacted droplets of the material from the droplet generator. In some embodiments, the apparatus further includes: a cooling element, where the controller is further configured to: after melting the plasma generation byproduct distributed on the vane, flow water through the cooling element to cool the vane; and after cooling the vane, cooling the byproduct transport ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
generating extreme ultraviolet light with an extreme ultraviolet source, the extreme ultraviolet source comprising a byproduct transport ring, a light collector, and vanes, the byproduct transport ring being disposed between the vanes and the light collector;
heating the byproduct transport ring for a first duration;
after heating the byproduct transport ring for the first duration, heating the vanes for a second duration; and
after heating the vanes for the second duration, cooling the vanes.

2. The method of claim 1, wherein the first duration is less than the second duration.

3. The method of claim 1, wherein generating the extreme ultraviolet light creates a byproduct, and the byproduct transport ring is heated to a first temperature that is less than a melting point of the byproduct.

4. The method of claim 3, wherein the vanes are heated to a second temperature that is greater than the melting point of the byproduct.

5. The method of claim 3, further comprising:
evacuating the byproduct from the extreme ultraviolet source through a drain line that extends through an opening in the byproduct transport ring.

6. The method of claim 1, wherein heating the byproduct transport ring reduces a temperature difference between upper portions of the vanes and lower portions of the vanes.

7. The method of claim 1, wherein heating the byproduct transport ring comprises heating the byproduct transport ring at a constant rate.

8. The method of claim 1, wherein heating the byproduct transport ring comprises heating the byproduct transport ring at a variable rate.

9. The method of claim 1, wherein heating the vanes comprises heating the vanes with resistive heating elements disposed along lengths of the vanes.

10. The method of claim 1, wherein generating the extreme ultraviolet light comprises:
generating a droplet of tin; and
striking the droplet with a laser beam.

11. A method comprising:
generating a plasma in a processing chamber by striking a tin droplet with a laser beam, a byproduct of the tin droplet being distributed on a vane in the processing chamber, an upper temperature of an upper portion of the vane being greater than a lower temperature of a lower portion of the vane during generation of the plasma;
reducing a difference between the upper temperature and the lower temperature by heating the lower portion of the vane;
after reducing the difference between the upper temperature and the lower temperature, melting the byproduct of the tin droplet on the vane by heating the upper portion of the vane and the lower portion of the vane with a heating element, the heating element extending along a length of the vane; and
evacuating the melted byproduct of the tin droplet from the processing chamber.

12. The method of claim 11, wherein heating the lower portion of the vane comprises:
heating a byproduct transport ring disposed beneath the vane, wherein heat is transferred from the byproduct transport ring to the lower portion of the vane.

13. The method of claim 12, wherein the byproduct of the tin droplet is not melted during the heating of the byproduct transport ring.

14. The method of claim 11, wherein the vane has a V-shape, and the heating element is disposed in a hollow region formed by sidewalls of the V-shape.

15. The method of claim 11, wherein heating the lower portion of the vane is performed for a first duration, heating the upper portion and the lower portion of the vane is performed for a second duration, and the second duration is different than the first duration.

16. The method of claim 11, further comprising:
after evacuating the byproduct of the tin droplet from the processing chamber, cooling the vane.

17. An apparatus comprising:
a plasma generator;
a light collector;
a byproduct transport ring above the light collector, the byproduct transport ring comprising a first heating element;
a drain line extending through the byproduct transport ring;
a vane above the byproduct transport ring;

a second heating element extending along a length of the vane;

a controller configured to:

generate a plasma above the light collector with the plasma generator, a plasma generation byproduct being distributed on the vane when the plasma is generated;

heat the first heating element of the byproduct transport ring to reduce a temperature difference between an upper portion and a lower portion of the vane; and after reducing the temperature difference, heat the second heating element to melt the plasma generation byproduct distributed on the vane, the plasma generation byproduct dripping into the drain line.

18. The apparatus of claim 17, further comprising:

a collector connected to the drain line, the plasma generation byproduct being evacuated to the collector through the drain line when melted.

19. The apparatus of claim 17, further comprising:

a heat shield having a channel holding the byproduct transport ring, the drain line extending through an opening in the heat shield.

20. The apparatus of claim 17, wherein the vane has a V-shape, and the second heating element is disposed in a hollow region formed by sidewalls of the V-shape.

* * * * *